United States Patent
Shin et al.

(10) Patent No.: US 9,158,354 B2
(45) Date of Patent: Oct. 13, 2015

(54) FOOTER-LESS NP DOMINO LOGIC CIRCUIT AND RELATED APPARATUS

(71) Applicants: Ken Keon Shin, Seongnam-Si (KR); Hoi Jin Lee, Seoul (KR); Gun Ok Jung, Yongin-Si (KR); Min Su Kim, Hwaseong-Si (KR)

(72) Inventors: Ken Keon Shin, Seongnam-Si (KR); Hoi Jin Lee, Seoul (KR); Gun Ok Jung, Yongin-Si (KR); Min Su Kim, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 288 days.

(21) Appl. No.: 13/795,852

(22) Filed: Mar. 12, 2013

(65) Prior Publication Data

US 2013/0246819 A1  Sep. 19, 2013

(30) Foreign Application Priority Data

Mar. 19, 2012 (KR) .................. 10-2012-0027740

(51) Int. Cl.
*G06F 1/04* (2006.01)
*G06F 1/32* (2006.01)
*H03K 19/00* (2006.01)
*H03K 19/096* (2006.01)

(52) U.S. Cl.
CPC .. *G06F 1/32* (2013.01); *G06F 1/04* (2013.01); *H03K 19/0008* (2013.01); *H03K 19/0963* (2013.01)

(58) Field of Classification Search
CPC ...................... H03K 3/0375; G06F 2207/3872
USPC .......................................................... 713/320
See application file for complete search history.

(56) References Cited

U.S. PATENT DOCUMENTS

| | | | |
|---|---|---|---|
| 5,541,536 A | 7/1996 | Rajivan | |
| 5,642,061 A * | 6/1997 | Gorny | 326/97 |
| 5,973,514 A * | 10/1999 | Kuo et al. | 326/98 |
| 6,040,716 A * | 3/2000 | Bosshart | 326/98 |
| 6,108,805 A * | 8/2000 | Rajsuman | 714/724 |
| 6,225,827 B1 * | 5/2001 | Fujii et al. | 326/98 |
| 6,265,899 B1 | 7/2001 | Abdel-Hafeez et al. | |
| 6,316,960 B2 | 11/2001 | Ye | |
| 6,366,134 B1 * | 4/2002 | Deng | 326/121 |
| 6,407,585 B1 | 6/2002 | Vinh | |
| 6,420,904 B1 | 7/2002 | Dutta et al. | |
| 6,552,573 B1 * | 4/2003 | Barton | 326/95 |
| 6,707,318 B2 * | 3/2004 | Kumar et al. | 326/98 |
| 7,852,121 B2 | 12/2010 | Rhee et al. | |
| 7,932,750 B2 | 4/2011 | Kim | |
| 2002/0130686 A1 * | 9/2002 | Forbes | 326/98 |
| 2003/0117179 A1 * | 6/2003 | Hsu et al. | 326/98 |
| 2006/0001451 A1 * | 1/2006 | Malik | 326/95 |

(Continued)

FOREIGN PATENT DOCUMENTS

| | | |
|---|---|---|
| KR | 100189734 B1 | 1/1991 |
| KR | 20000054959 A | 9/2000 |

(Continued)

*Primary Examiner* — Vincent Tran
(74) *Attorney, Agent, or Firm* — Volentine & Whitt, PLLC

(57) ABSTRACT

A domino logic circuit includes a pre-charge circuit pre-charging a first dynamic node in response to a clock signal, a first logic network determining a logic level of the first dynamic node in response to first data signals, an inverter receiving the clock signal, a discharge circuit discharging a second dynamic node in response to an output signal of the inverter, and a second logic network determining a logic level of the second dynamic node in response to at least one second data signal and an output signal of the first dynamic node.

16 Claims, 12 Drawing Sheets

(56) References Cited

U.S. PATENT DOCUMENTS

2007/0024322 A1\* 2/2007 Ye et al. .................... 326/98
2007/0057698 A1\* 3/2007 Verbauwhede et al. ........ 327/52

FOREIGN PATENT DOCUMENTS

| KR | 1020060002551 A | 1/2006 |
| KR | 20100134937 A | 12/2010 |

\* cited by examiner

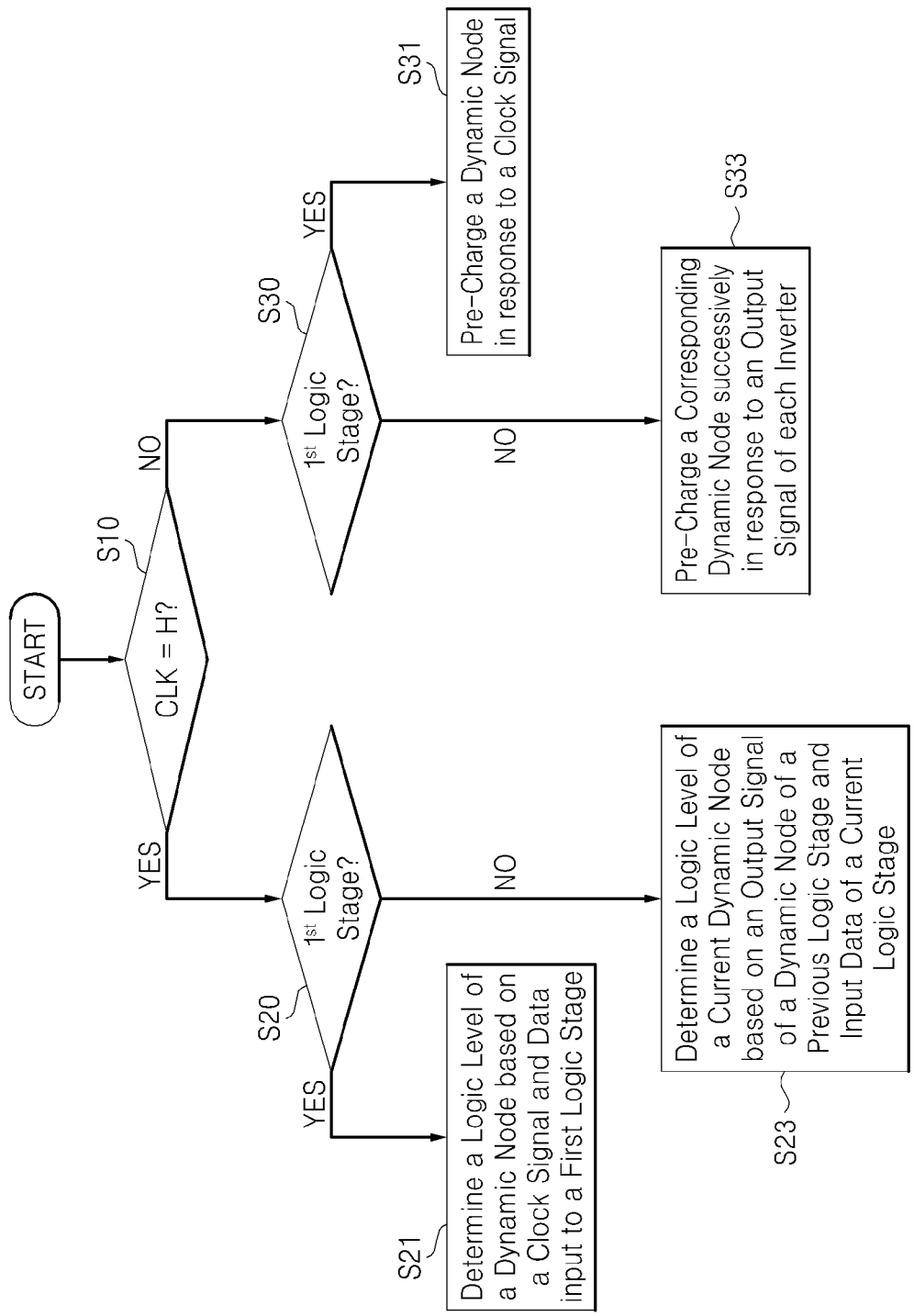

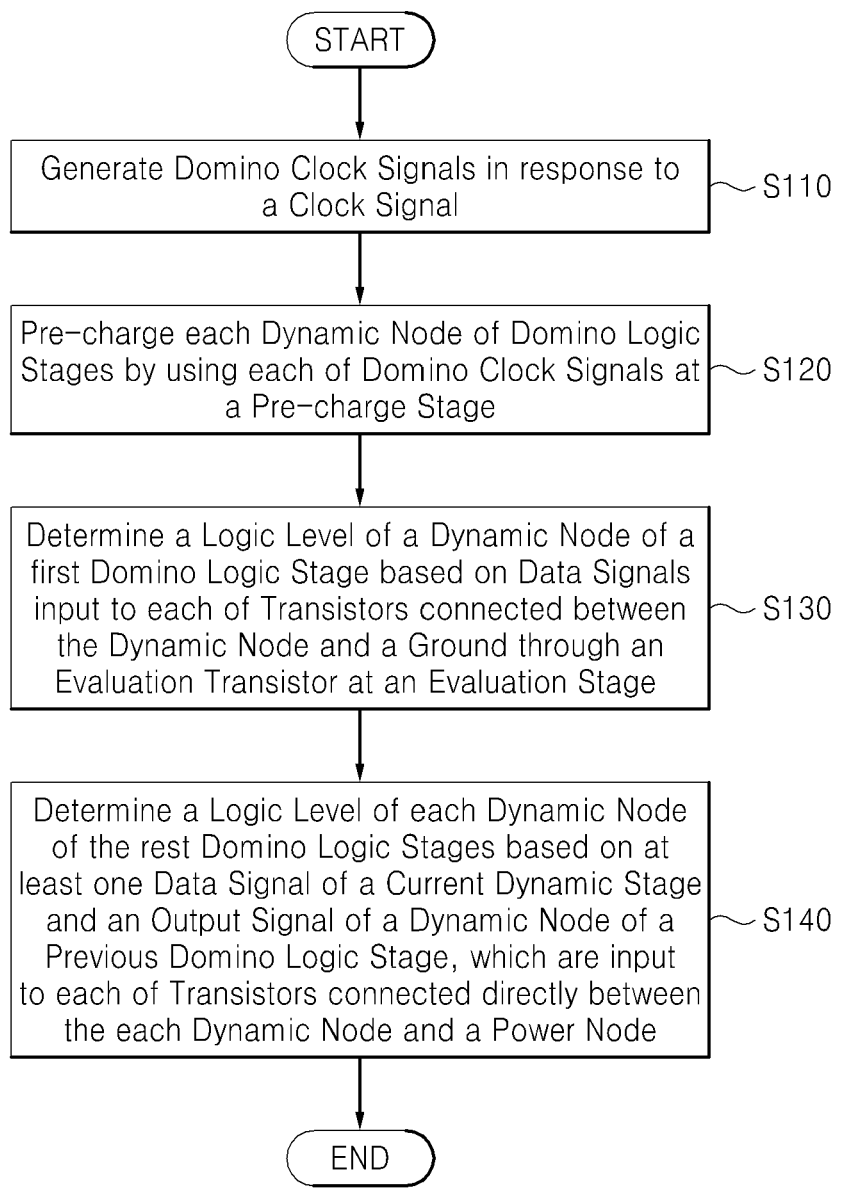

FOOTER-LESS NP DOMINO LOGIC CIRCUIT AND RELATED APPARATUS

CROSS-REFERENCE TO RELATED APPLICATIONS

This application claims priority under 35 U.S.C. §119(a) from Korean Patent Application No. 10-2012-0027740 filed on Mar. 19, 2012, the subject matter of which is hereby incorporated by reference.

BACKGROUND

Embodiments of the inventive concept relate generally to domino logic circuits and apparatuses incorporating same. More particularly, embodiments of the inventive concept relate to footer-less NP domino logic circuits capable of accurately processing data at relatively high-speed.

Domino logic circuits are often used as part of a critical path for a processor or other digital logic device. Such circuits provide low data latency. Moreover, domino logic circuits are generally able to reduce the overall size of a constituent function block, while offering relatively high-speed data processing and lower power consumption. As the operating speed of processors including domino logic circuits increases, power consumption by the processor increases. Accordingly, a demand exists for a processor having relatively reduced power consumption, yet being capable of running at a high operating speed. Subsequently, demand exists for domino logic circuits having structures that enable high speed operation at reduced power consumption.

SUMMARY

An embodiment of the present invention is directed to a domino logic circuit comprising; a pre-charge circuit that pre-charges a first dynamic node in response to a clock signal, a first logic network that determines a logic level of the first dynamic node in response to first data signals, an inverter that receives the clock signal, a discharge circuit that discharges a second dynamic node in response to an output signal of the inverter, and a second logic network that determines a logic level of the second dynamic node in response to one or more second data signals and an output signal of the first dynamic node.

An embodiment of the present invention is directed to a pipelined domino logic circuit comprising; a plurality of domino logic stages series connected between a latch and a flip-flop and including a first domino stage having a first dynamic node, and second through Nth domino logic stages each having a corresponding dynamic node, wherein during an evaluation phase, a logic level of the first domino logic stage is determined in response to an output signal of the latch and at least one input data signal applied to transistors connected between the first dynamic node and ground through an evaluation transistor, and during the evaluation phase, a logic level for each corresponding dynamic node of the second through Nth domino logic stages is respectively determined in sequence as a current domino logic stage in response to at least one data signal applied to the current domino logic stage and an output signal provided by a previous domino logic stage as respectively applied to transistors connected directly between the corresponding dynamic node and a power node.

An embodiment of the present invention is directed to a pipelined domino logic circuit comprising; a plurality of domino logic stages including an alternating arrangement of series-connected N-domino logic stages and P-domino logic stages, and a domino clock signal generation circuit generating a plurality of domino stage clock signals derived from a clock signal, each domino stage clock signal having a unique delay and one of two alternating phases, wherein during a pre-charge phase each dynamic node respectively associated with one of the plurality of domino logic stages is sequentially pre-charged in response to a corresponding one of the plurality of domino stage clock signals.

An embodiment of the present invention is directed to a central processing unit (CPU) comprising; an arithmetic logic unit (ALU) and a control unit that controls operation of the ALU, wherein the ALU comprises a plurality of domino logic stages including an alternating arrangement of N-domino logic stages and P-domino logic stages series including a first domino stage having a first dynamic node, and second through Nth domino logic stages each having a corresponding dynamic node, wherein during an evaluation phase, a logic level of the first domino logic stage is determined in response to an output signal of the latch and at least one input data signal applied to transistors connected between the first dynamic node and ground through an evaluation transistor, and during the evaluation phase, a logic level for each corresponding dynamic node of the second through Nth domino logic stages is respectively determined in sequence as a current domino logic stage in response to at least one data signal applied to the current domino logic stage and an output signal provided by a previous domino logic stage as respectively applied to transistors connected directly between the corresponding dynamic node and a power node.

An embodiment of the present invention is directed to a data processing device comprising; a memory device and a central processing unit (CPU) that controls operation of the memory device, wherein the CPU includes an arithmetic logic unit (ALU) and a control unit that controls operation of the ALU, wherein the ALU comprises; a plurality of domino logic stages including an alternating arrangement of N-domino logic stages and P-domino logic stages series including a first domino stage having a first dynamic node, and second through Nth domino logic stages each having a corresponding dynamic node, wherein during an evaluation phase, a logic level of the first domino logic stage is determined in response to an output signal of the latch and at least one input data signal applied to transistors connected between the first dynamic node and ground through an evaluation transistor, and during the evaluation phase, a logic level for each corresponding dynamic node of the second through Nth domino logic stages is respectively determined in sequence as a current domino logic stage in response to at least one data signal applied to the current domino logic stage and an output signal provided by a previous domino logic stage as respectively applied to transistors connected directly between the corresponding dynamic node and a power node.

An embodiment of the present invention is directed to a method operating a logic circuit, comprising; determining during an evaluation phase, a logic level of a dynamic node of a first domino logic stage among a plurality of series-connected domino logic stages in response to input data signals applied to transistors connected between the dynamic node and ground through an evaluation transistor, and sequentially determining during the evaluation phase, a logic level of dynamic nodes respectively associated with second through Nth domino logic stages in the plurality of domino logic stages in response to at least one data signal and an output signal provided by a previous domino logic stage as applied to transistors connected directly between the respective dynamic node and a power node.

BRIEF DESCRIPTION OF THE DRAWINGS

FIG. 11 is a flowchart summarizing one possible operation for the pipelined domino logic circuit of FIG. 1; and FIG. 12 is a flowchart summarizing one possible operation for the pipelined domino logic circuit of FIG. 4.

DETAILED DESCRIPTION

Figure 1:
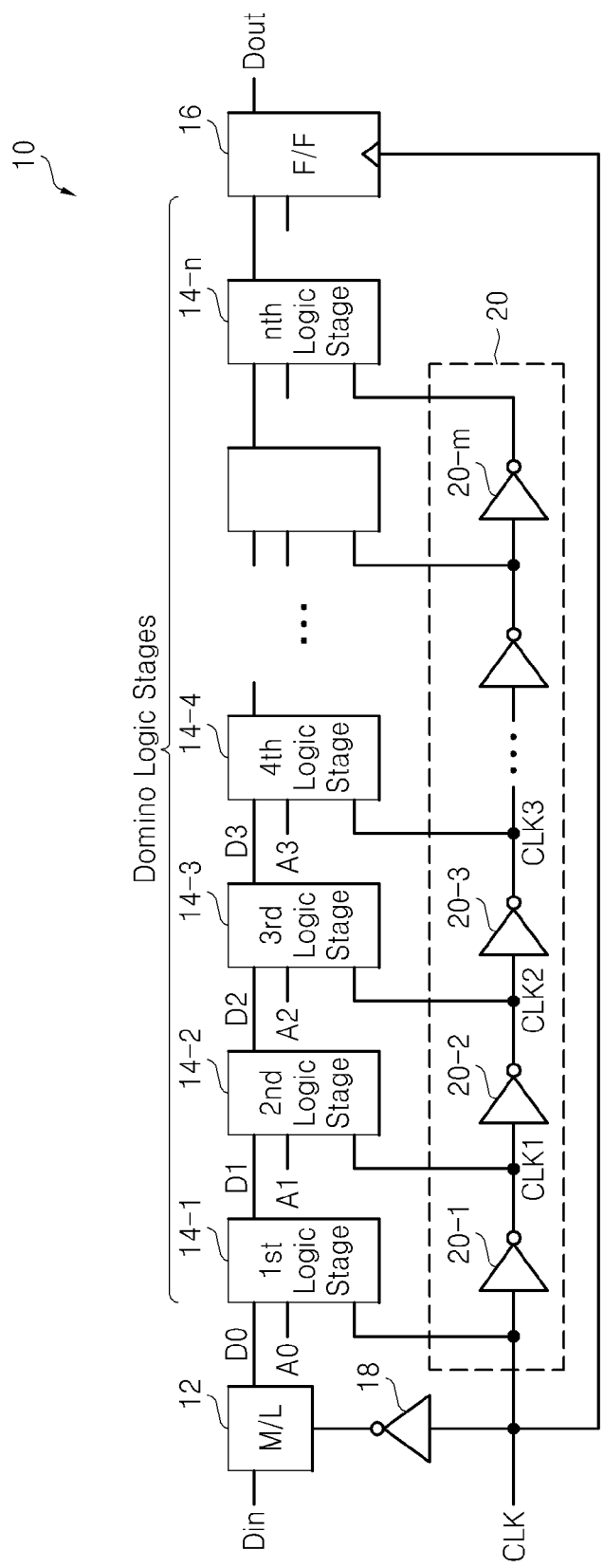
FIG. 1 is a block diagram illustrating a pipelined domino logic circuit including a domino logic circuit according to an embodiment of the inventive concept.

FIG. 1 is a block diagram illustrating a pipelined domino logic circuit including a domino logic circuit according to an embodiment of the inventive concept. Referring to FIG. 1, a pipelined domino logic circuit 10 comprises a plurality of domino logic stages 14-1 to 14-$n$ series-connected between a latch 12 and a flip-flop 16. The pipelined domino logic circuit 10 further comprises an inverter 18 connected between a clock signal (CLK) input and the latch 12, and a clock signal inverter chain 20. The clock signal inverter chain includes a plurality of series-connected inverters 20-1 to 20-$m$.

Within this configuration, the latch 12 serves as a master latch. That is, the latch 12 latches input data (Din) in response to an inverted clock signal provided by the inverter 18.

The pipelined domino logic circuit 10 may be understood as a type of domino logic circuit, a cascaded domino logic circuit, and/or a footer-less NP domino logic circuit. In the illustrated embodiment of FIG. 1, the domino logic circuit is an example of dynamic logic.

Figure 2:
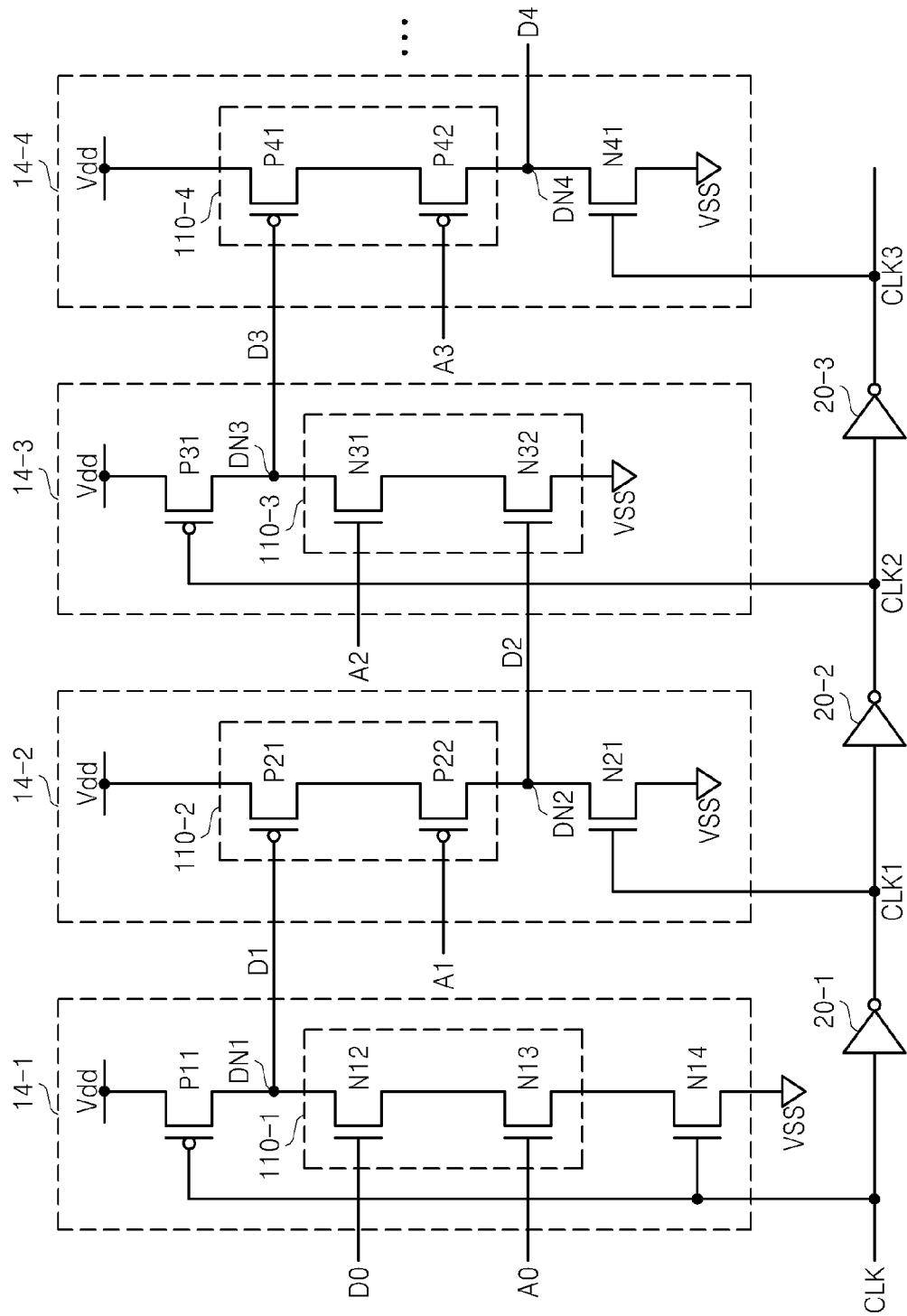
FIG. 2 is a circuit diagram further illustrating a portion of the pipelined domino logic circuit of FIG. 1.

FIG. 2 is a circuit diagram further illustrating a portion of the pipelined domino logic circuit 10 of FIG. 1. For purposes of this description it is assumed that a logically "low" activation level of the clock signal results in the following operation of the series-connected domino logic stages 14-1 to 14-$n$. Namely, the master latch 12 latches input data in response to the inverted clock signal provided by the inverter 18, and each of the domino logic stages 14-1 to 14-$n$ in the pipelined domino logic circuit 10 performs a pre-charge operation (i.e., enters a pre-charge phase of operation). That is, in response to a low clock signal, each MOS transistor P11, N21, P31 and N41 turns ON and an NMOS transistor N14 turns OFF.

In this configuration, the threshold voltage of MOS transistors P11 and P31 are designed to be less than the threshold voltage of MOS transistor P21, P22, P41 and P42. In addition, the threshold voltage of MOS transistors N21 and N41 are designed to be less than the threshold voltage of MOS transistors N12, N13, N31 and N32. For example, a difference between the threshold voltage of MOS transistor P11 and the threshold voltage of MOS transistor P21 may be about 100 mV.

Referring to FIGS. 1 and 2, a first domino logic stage 14-1 comprises a pre-charge circuit P11, a logic network 110-1, and an evaluation transistor N14.

Within this configuration the evaluation transistor N14 may be called a "footer". MOS transistors P11 and N14 operate complementarily such that a short-circuit current does not flow between a first node supplying a power voltage Vdd and a second node connected to ground voltage VSS.

The pre-charge circuit P11 of a first domino logics stage 14-1 pre-charges a first dynamic node DN1 with a pre-charge voltage in response to a low clock signal CLK. The pre-charge voltage may be simply expressed as the power voltage Vdd, or more particularly, as the power voltage Vdd less the threshold voltage of the pre-charge circuit P11 (Vdd-P11_Vth).

A second domino logic stage 14-2 includes a logic network 110-2 and discharge circuit N21. The discharge circuit N21 of the second domino logic stage 14-2 discharges a second dynamic node DN2 to ground voltage VSS in response to a "high" clock signal CLK1 provided by a first inverter 20-1.

A third domino logic stage 14-3 includes a pre-charge circuit P31 and a logic network 110-3. The pre-charge circuit P31 of the third domino logic stage 14-3 pre-charges a third dynamic node DN3 with the pre-charge voltage in response to the low clock signal CLK2 provided by a second inverter 20-2.

A fourth domino logic stage 14-4 includes a logic network 110-4 and a discharge circuit N41. The discharge circuit N41 of the fourth domino logic stage 14-4 discharges a fourth dynamic node DN4 to ground voltage VSS in response to the high clock signal provided by a third inverter 20-3.

Thus, as described above in accordance with the illustrated embodiment of FIG. 1, when a low clock signal CLK is assumed, each "dynamic node" of the series-connected domino logic stages 14-1 to 14-$n$ is sequentially pre-charged with either a pre-charge voltage or ground voltage VSS. As a result, during a pre-charge phase of operation, the pre-charge of alternating dynamic node includes either the pre-charging of a dynamic node to a pre-charge voltage, or the pre-charging of a dynamic node to ground voltage VSS. This result is facilitated by the toggling logic level of the applied clock signal CLK through the clock signal inverter chain 20.

Of further note, when the clock signal is high, each of the series-connected domino logic stages 14-1 to 14-$n$ of the pipelined domino logic circuit 10 performs an evaluation operation (or enters an evaluation phase of operation).

For convenience of explanation, FIG. 2 illustrates an example wherein each logic network 110-1 to 110-4 is implemented with a two-input NAND gate. However, those skilled in the art will understand that other embodiments of the inventive concept are not restricted to the number of input signals input to the each logic network 110-1 to 110-4.

According to embodiments of the inventive concept, at least two MOS transistors may be connected in series, in parallel, or in a combination of serial and parallel. The term "power node" is used to denote either the first node or the second node.

When a clock signal CLK is high, MOS transistors P11, N21, P31 and P41 are turned OFF.

The logic network 110-1 of the first domino logic stage 14-1 determines the logic level of a first dynamic node DN1 in response to the high clock signal, an output signal D0 provided by the master latch 12, and a first data signal A0. For example, when output signal D0 and data signal A0 are both high, the logic level of the first dynamic node DN1 toggles from high to low. For all other input signal logic combinations, the logic level of the first dynamic node DN1 remains high.

Then, the logic network 110-2 of a second domino logic stage 14-2 (i.e., a current domino logic stage) determines the logic level of the second dynamic node DN2 in response to the first output signal D1 provided by the first dynamic node DN1 of the first domino logic stage 14-1 (i.e., a previous domino logic stage output signal) and a second data signal A1.

Figure 3:
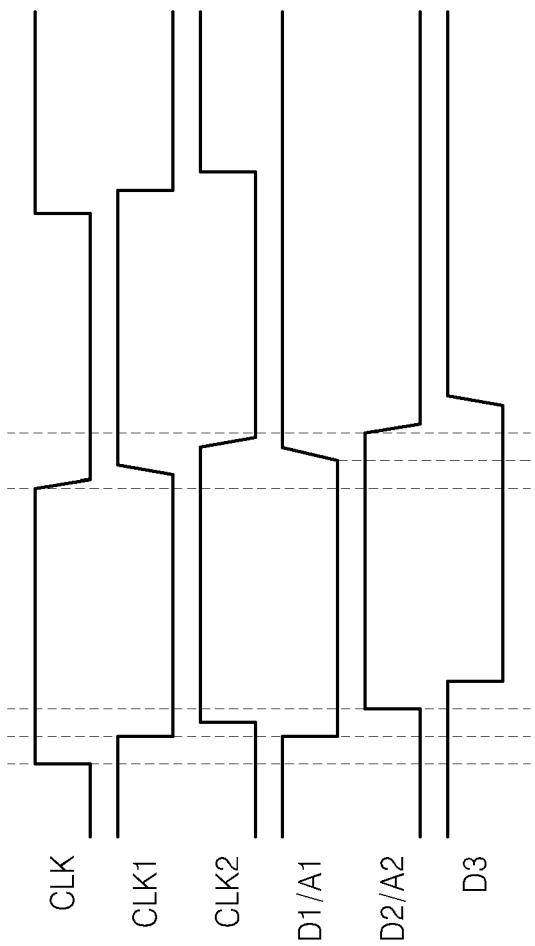
FIG. 3 is a timing diagram illustrating input and output signals for the pipelined domino logic circuit of FIG. 1.

As further illustrated in the related timing diagram of FIG. 3, when the first output signal D1 and the first data signal A1 are both high, the logic level of the second dynamic node DN2 is low.

The logic network 110-3 of a third domino logic stage 14-3, now the current domino logic stage, determines the logic level of a third dynamic node DN3 in response to the second output signal D2 of the second dynamic node DN2 of the second domino logic stage 14-2, now the output signal of the previous domino logic stage, and the third data signal A2. As illustrated in FIG. 3, when the second output signal D2 and the third data signal A2 are both low, the logic level of the third dynamic node DN3 is high.

Finally, the logic network 110-4 of a fourth domino logic stage 14-4, now the current domino logic stage, determines the logic level of a fourth dynamic node DN4 in response to the third output signal D3 of the third dynamic node DN3 of the third domino logic stage 14-3 and a fourth data signal A3.

In this manner, the logic level for each dynamic node of each successive domino logic stages 14-2 to 14-n among the plurality of domino logic stages 14-1 to 14-n may be sequentially determined in accordance with an output signal provided by the dynamic node of a previous domino logic stage and at least one data signal applied to the current domino logic stage.

Within this configuration, the structure of each odd numbered domino logic stage, excepting the first domino logic stage 14-1, may be the same as the structure of the third domino logic stage 14-3. Further, each odd numbered domino logic stage 14-1, 14-3, . . . may be embodied in an N-domino (logic) stage, where each odd numbered N-domino stage, excepting the first N-domino stage 14-1, does not include a footer like the evaluation transistor N14 of the first N-domino stage 14-1. In this context, the 'N' of the term "N-domino" denotes a first semiconductor conductivity type, as compared with a second semiconductor conductivity type 'P'.

In similar manner, the structure of each even numbered domino logic stage 14-2, 14-4, . . . may be the same as the structure of the second domino logic stage 14-2. Each even numbered domino logic stage 14-2, 14-4, . . . , 14-n may be embodied in a P-domino (logic) stage.

Referring again to FIG. 2, each logic network included in each logic stage 14-1 to 14-n may be embodied by a NAND gate, a NOR gate, an AND-OR-Invert (AOI) gate or an OR-AND-Invert (OAI) gate which includes at least two input terminals receiving at least two data signals.

FIG. 3 is a timing diagram further illustrating certain input and output signals applied to or generated by the pipelined domino logic circuit of FIG. 1.

Referring collectively to FIGS. 1, 2 and 3, during an evaluation phase, the logic level of each dynamic node may be correctly determined only when data signals are applied to each logic network 110-1 to 110-4 after each MOS transistor P11, N21, P31 and N41 is turned OFF. However, during a pre-charge phase, each dynamic node may be appropriately pre-charged only when each (inverted) stage of the clock signal CLK (e.g., CLK to CLK1 to CLK2 to CLK3, etc.) is applied after the previous stage output signal (D0, D1, D2, etc.) and corresponding data signal (A0, A1, A2, etc.) are applied. Moreover, as illustrated in FIG. 3, the rising time for each clock signal stage CLK, CLK1, CLK2 and CLK3 should be shorter than the falling time for each clock signal stage CLK, CLK1, CLK2, and CLK3.

The flip-flop 16 latches an output signal provided by the dynamic node of a last domino logic stage 14-n in response to a final clock signal CLK stage. An output signal Dout for the flip-flop 16 may then be provided to an external circuit.

Figure 4:
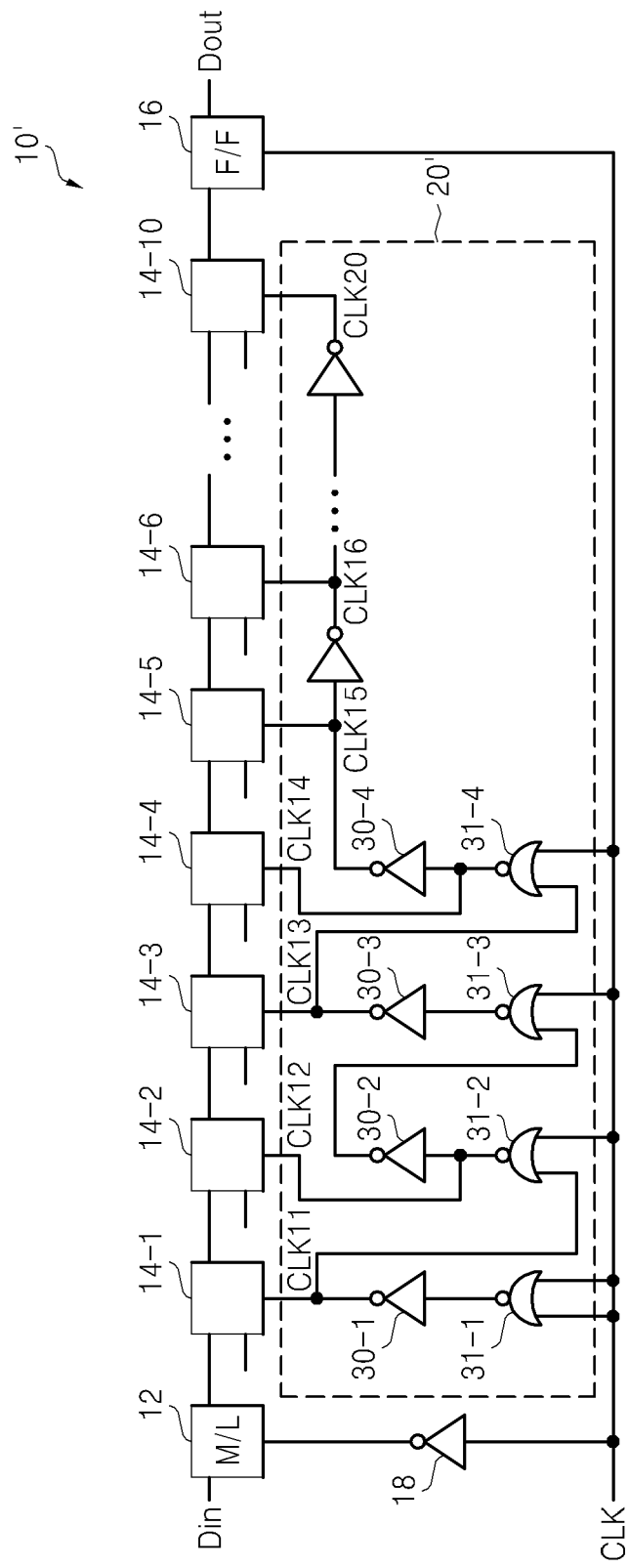
FIG. 4 is a block diagram illustrating a pipelined domino logic circuit including a domino logic circuit according to another embodiment of the inventive concept.
Figure 5:
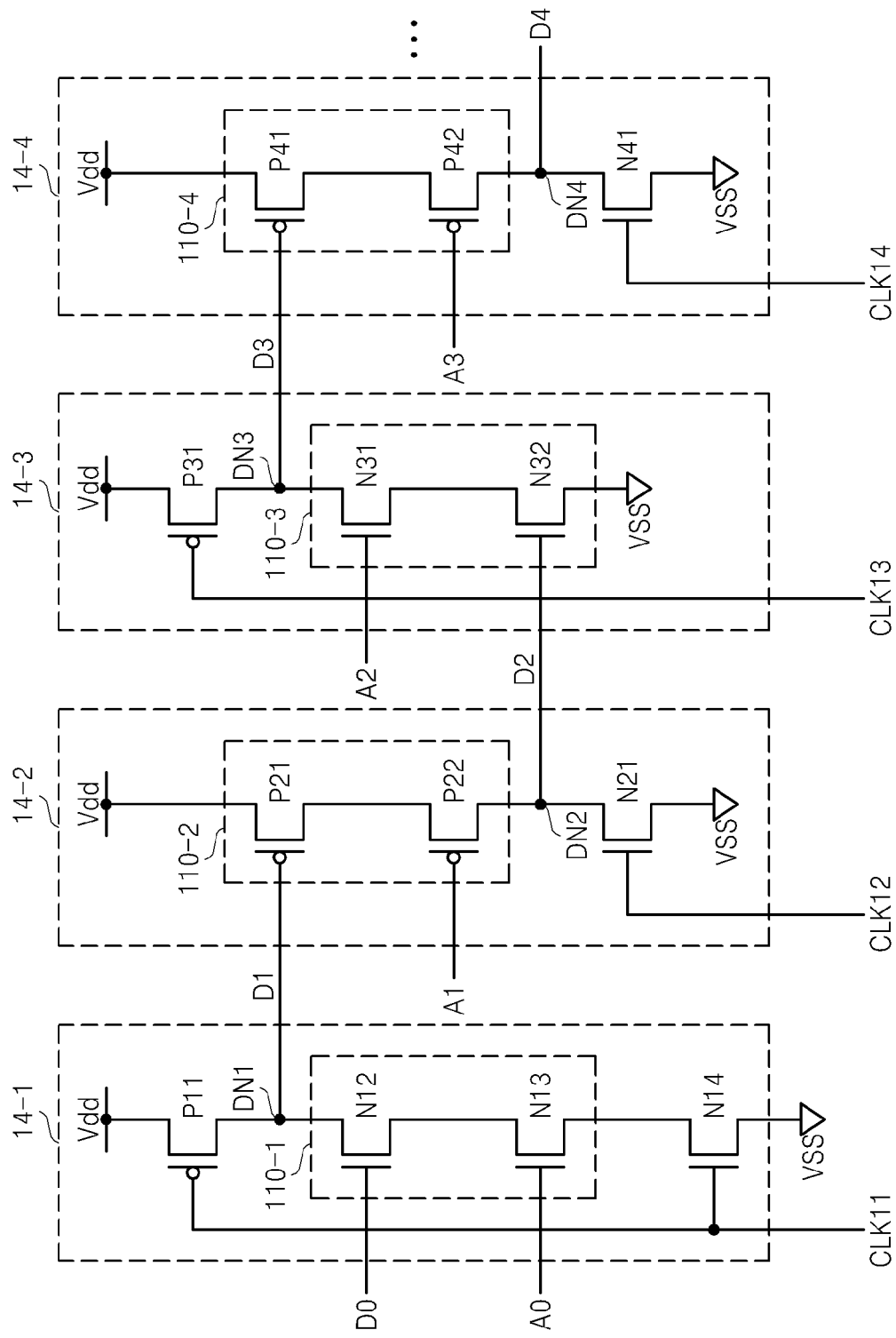
FIG. 5 is a circuit diagram further illustrating a portion of the pipelined domino logic circuit of FIG. 4.

FIG. 4 is a block diagram illustrating a pipelined domino logic circuit including a domino logic circuit according to another embodiment of the inventive concept. FIG. 5 is a circuit diagram further illustrating a portion of the pipelined domino logic circuit of FIG. 4, and FIG. 6 is a related waveform diagram for the domino clock signals provide by a domino clock signal generation circuit of FIG. 4.

Referring to FIG. 4, a pipelined domino logic circuit 10' includes a plurality of domino logic stages 14-1 to 14-10 series-connected between the master latch 12 and flip-flop 16, the inverter 18, and a domino clock signal generation circuit 20'.

Figure 6:
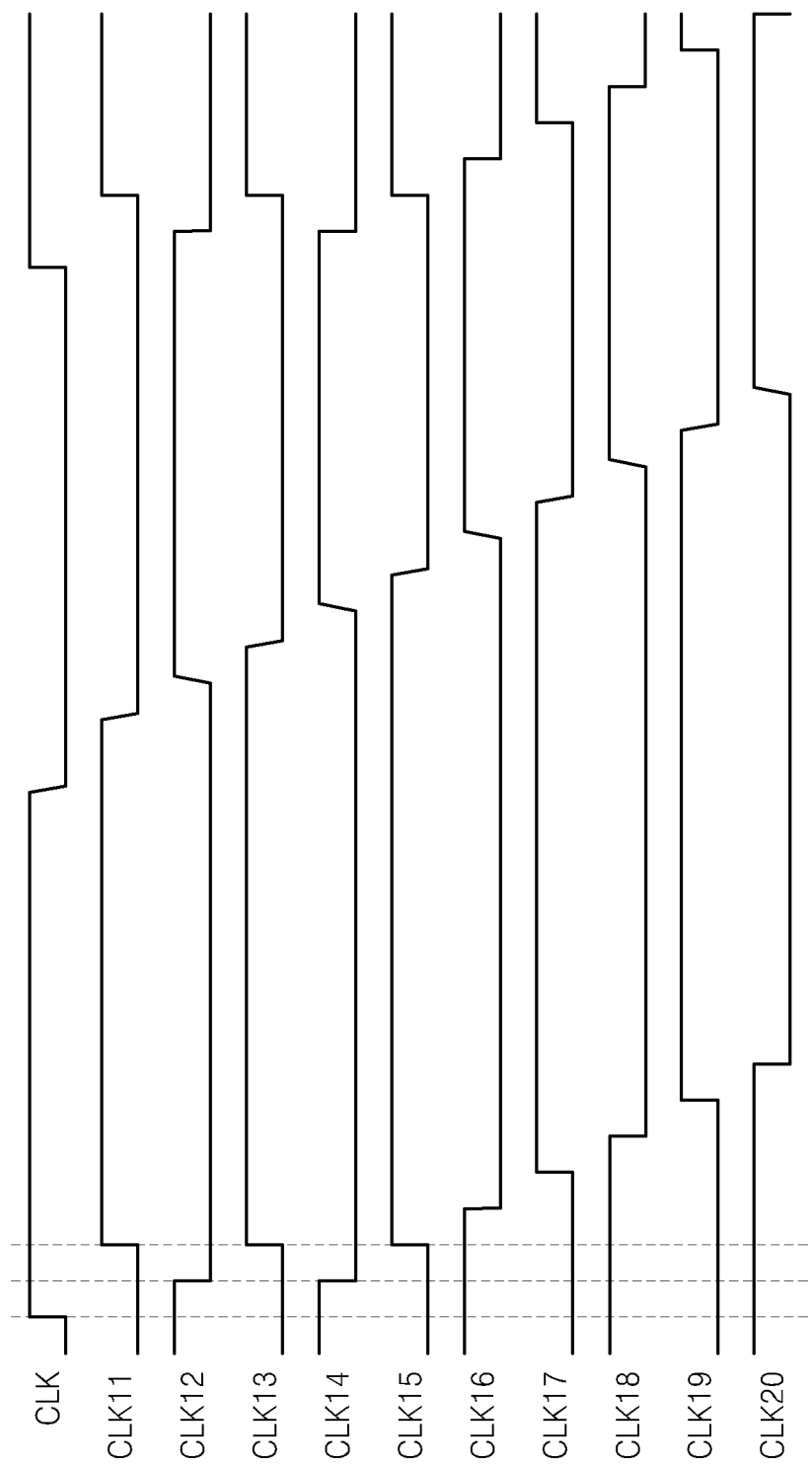
FIG. 6 is a waveform diagram illustrating domino stage clock signals output by the domino clock signal generation circuit of FIG. 4.

The domino clock signal generation circuit 20' may be used to generate a plurality of domino stage clock signals CLK11 to CLK20 derived from the externally provided clock signal CLK as illustrated in FIG. 6. For convenience of explanation, FIG. 4 illustrates gates for synchronizing a rising edge, i.e., an evaluation edge, of each domino stage clock signal CLK11, CLK13 and CLK15. However, other clocking schemes may be used within other embodiments of the inventive concept.

The domino clock signal generation circuit 20' includes first inverters 30-1, 30-2, 30-3 and 30-4, NOR gates 31-1, 31-2, 31-3 and 31-4 and second inverters.

A NOR gate 31-1 performs a NOR operation on a clock signal, and an inverter 30-1 generates a first domino clock signal CLK11 by inverting an output signal of the NOR gate 31-1. The first domino clock signal CLK11 is input to the first domino logic stage 14-1.

A NOR gate 31-2 performs a NOR operation on a clock signal CLK and an output signal of the inverter 30-1. An output signal of the NOR gate 31-2 is input to the second domino logic stage 14-2 as a second domino clock signal CLK12.

A NOR gate 31-3 performs a NOR operation on a clock signal CLK and an output signal of an inverter 30-2. An output signal of the NOR gate 31-3 is input to an inverter 30-3, and an output signal of the inverter 30-3 is input to a third domino logic stage 14-3 as a third domino clock signal CLK13.

A NOR gate 31-4 performs a NOR operation on a clock signal CLK and an output signal of the inverter 30-3. An output signal of a NOR gate 31-4 is input to a fourth domino logic stage 14-4 as a fourth domino clock signal CLK14. An output signal of an inverter 30-4 is input to a fifth domino logic stage 14-5 as a fifth domino clock signal CLK15.

An output signal CLK16 to CLK20 of each inverter is input to each domino logic stage 14-6 to 14-10.

As illustrated in FIG. 6, the falling edges (i.e., a pre-charge edge) of domino clock signals CLK12 and CLK14 are synchronized. The operation of domino stage 14-1 to 14-4 illustrated in FIG. 5 is similar to that domino stage 14-1 to 14-4 illustrated in FIG. 2, so that an operation of each domino stage 14-1 to 14-4 may be understood according to a timing diagram illustrated in FIG. 6.

Figure 7:
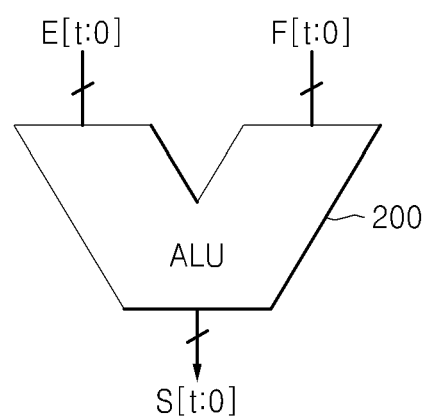
FIG. 7 is a block diagram of an arithmetic logic unit (ALU) including the pipelined domino logic circuit illustrated in FIG. 1 or 4.
Figure 8:
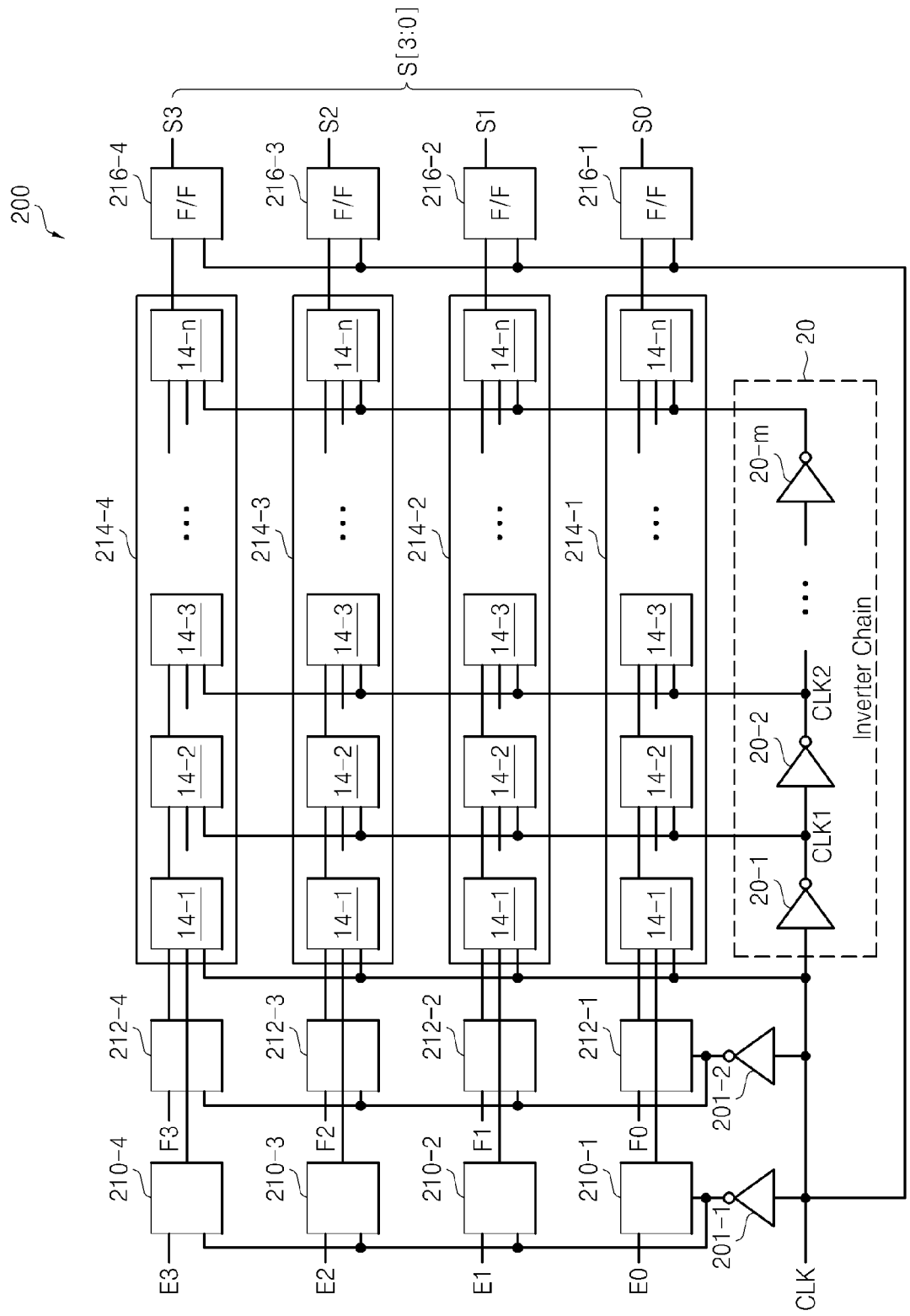
FIG. 8 is a block diagram of a four-bit adder incorporating the pipelined domino logic circuit of FIG. 1.

FIG. 7 is a block diagram of an arithmetic logic unit (ALU) that may incorporate a pipelined domino logic circuit like the one illustrated in FIGS. 1 and 4. The ALU 200 of FIG. 7 illustrates a four-bit ALU example. FIG. 8 is a block diagram of a four-bit adder according to another embodiment of the inventive concept including the pipelined domino logic circuit of FIG. 1.

Referring to FIGS. 7 and 8, the ALU 200 adds a first data signal E[3:0] and a second data signal F[3:0] to output a third data signal S[3:0]. Each first master latch 210-1 to 210-4 latches a data bit E0, E1, E2 and E3 in response to an inverted clock signal output from an inverter 201-1. Each second master latch 212-1 to 212-4 latches a data bit F0, F1, F2 and F3 in response to an inverted clock signal output from an inverter 201-2.

Each stage block 214-1, 214-2, 214-3 and 214-4 includes each of the domino logic stages 14-1 to 14-N. In response to the clock signal CLK, each flip-flop 216-1 to 216-4 latches an output signal provided by a corresponding "last" domino logic stage 14-$n$ of stage blocks 214-1, 214-2, 214-3 and 214-4.

During an evaluation phase, the logic network of the first domino logic stage 14-1 of the first stage block 214-1 determines a logic level of its own dynamic node in response to data signal E0 and F0 output from each master latch 210-1 and 212-1. During the evaluation phase, the logic network of the first domino logic stage 14-1 of the second stage block 214-2 determines a logic level of its own dynamic node in response to each data signal E1 and F1 output from each master latch 210-2 and 212-2.

During an evaluation phase, the logic network of a first domino logic stage 14-1 of the third stage block 214-3 determines a logic level of its own dynamic node in response to each data signal E2 and F2 output from each master latch 210-3 and 212-3. During the evaluation phase, the logic network of the first domino logic stage 14-1 of the fourth stage block 214-4 determines the logic level of its own dynamic node in response to each data signal E3 and F3 output from each master latch 210-4 and 212-4.

A data signal which is not indicated but input to each domino logic stage 14-2 to 14-$n$ may be output from a corresponding data source according to a design specification in FIG. 8.

Figure 9:
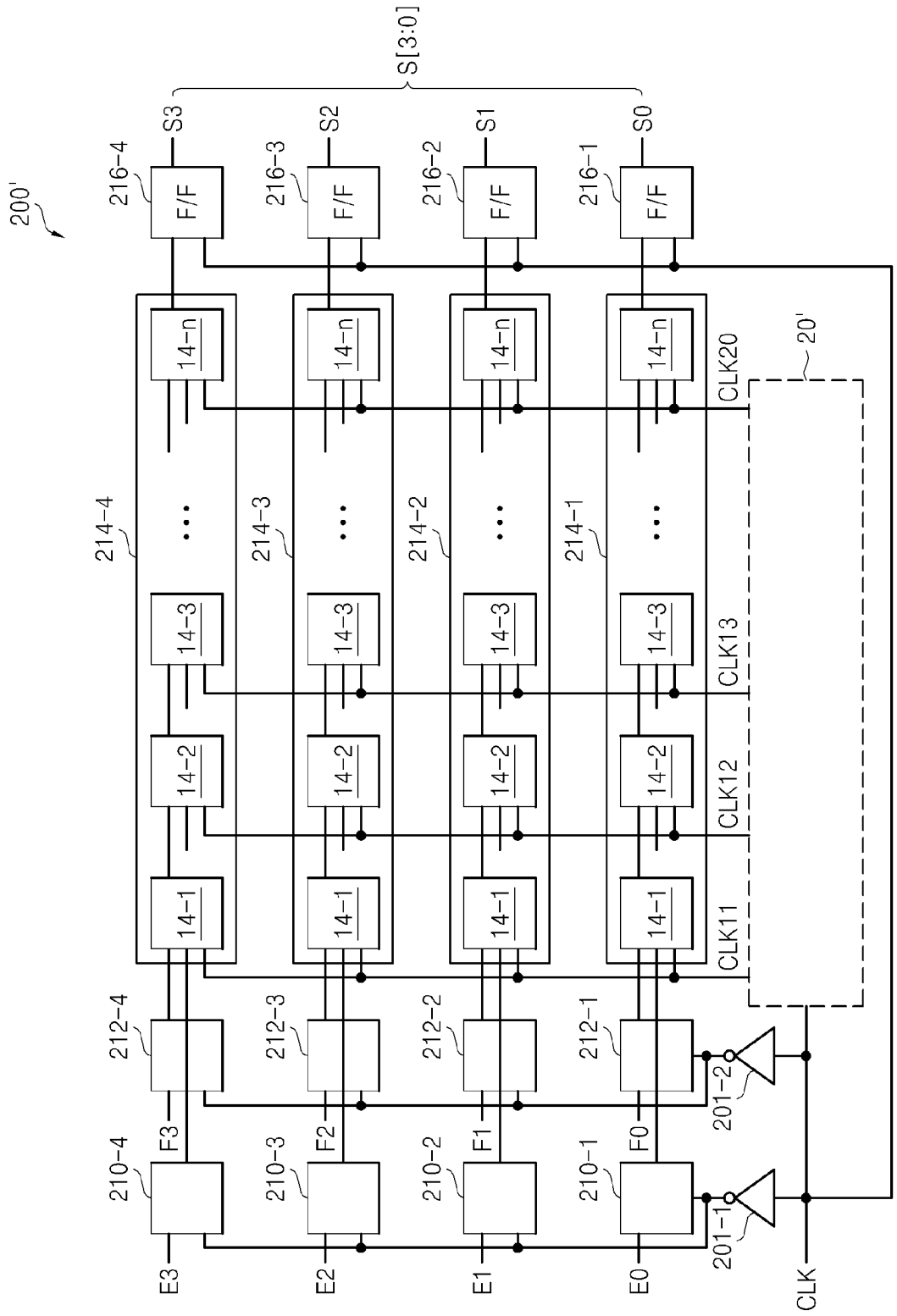
FIG. 9 is a block diagram of a four-bit adder incorporating the pipelined domino logic circuit of FIG. 4.

FIG. 9 is a block diagram of a four-bit adder 200' according to another embodiment of the inventive concept and includes the pipelined domino logic circuit of FIG. 4. The operation of the four-bit adder 200' of FIG. 9 is substantially the same as an operation of the four-bit adder 200 of FIG. 8 so a detailed explanation of the operation of the four-bit adder 200' is omitted. For convenience of explanation, carry-in and carry-out is not separately illustrated in the adder 200 of FIG. 8 and the adder 200' of FIG. 9.

Figure 10:
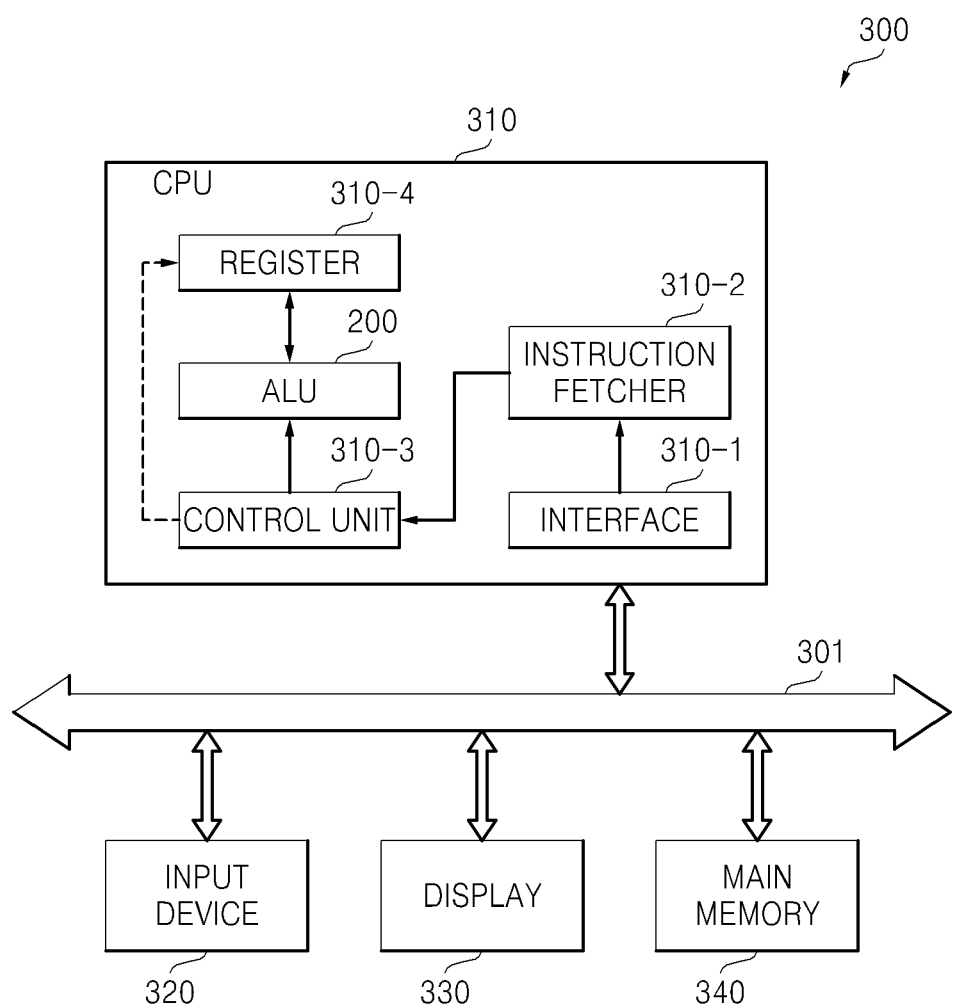
FIG. 10 is a block diagram of a data processing device including the ALU of FIG. 7.

FIG. 10 is a block diagram of a data processing device including an ALU like the one described in relation to FIG. 7. Referring to FIG. 10, a data processing device 300 comprises a central processing unit (CPU) 310, an input device 320, a display 330 and a main memory 340. Each element 310, 320, 330 and 340 communicates with each other through a bus 301.

The data processing device 300 may be embodied in a personal computer (PC), a data server or a portable device. The portable device may be embodied in a laptop computer, a cellular phone, a smart phone, a tablet PC, a personal digital assistant (PDA), an enterprise digital assistant (EDA), a digital still camera, a digital video camera, a portable multimedia player, a personal navigation device or portable navigation device (PND), a handheld gate console, or an e-book.

A CPU 310 may control the input device 320, the display 330 and the main memory 340. The CPU 310 includes an interface 310-1, a command fetcher 310-2, a control unit 310-3, an ALU 200 and a register 310-4. For example, a command fetched from the main memory 340 by the command fetcher 310-2 is transmitted to the control unit 310-3 through the interface 310-1 and the command fetcher 310-2.

The control unit 310-3 controls the ALU 200 according to a command output from the command fetcher 310-2. For example, as explained referring to FIGS. 7 to 9, when the command is an addition command on the first data signals E[3:0] and the second data signals F[3:0], the ALU 200 adds the first data signal E[3:0] and the second data signals F[3:0] output from the register 310-4. Here, the control unit 310-3 may transmit a command, which instructs an output of the first data signals E[3:0] and the second data signals F[3:0], to the register 310-4. The register 310-4 may be a storage or a register file. The calculation result of the ALU 200, e.g., the addition result, may be transmitted to the register 310-4.

FIG. 11 is a flowchart summarizing one possible operation for the pipelined domino logic circuit 10 of FIG. 1. Referring to FIGS. 1 to 11, when the clock signal CLK is low, or a falling edge is detected (i.e., a pre-charge edge), the pipelined domino logic circuit 10 enters the pre-charge phase, and when the clock signal CLK is high or a rising edge is detected (i.e., an evaluation edge), the pipelined domino logic circuit 10 enters the evaluation phase.

When the clock signal CLK is high (S10=YES) and a current domino logic stage is the first domino logic stage 14-1 (S20=YES), the first domino logic stage 14-1 determines a logic level of its own dynamic node DN1 in response to the clock signal CLK and data signals input to the first domino logic stage 14-1 (S21). That is, the first domino logic stage 14-1 determines a logic level of a dynamic node DN1 based the input data signals D0 and A0, which are applied to the transistors N12 to N13 connected between a dynamic node DN1 and ground VSS through an evaluation transistor N14 (S21).

However, when the clock signal CLK is high (S10=YES) and a current domino logic stage 14-2 to 14-$n$ is not the first domino logic stage 14-1 (S20=NO), the current domino logic stage 14-2 to 14-$n$ determines a logic level of a current dynamic node based on an output signal of a previous domino logic stage and one or more data signals input to the current domino logic stage 14-2 to 14-$n$ (S23).

That is, the logic level of a corresponding current dynamic node of a corresponding current domino logic stage 14-2 to 14-$n$ may be sequentially determined in response to the output signal of a corresponding previous domino logic stage and one or more data signals of the corresponding current dynamic stage, which are input to transistors connected directly between the current dynamic node and a power node.

For example, when the current domino logic stage is an N-domino logic stage, the power node may be a second node supplying ground voltage VSS. When the current domino logic stage is a P-domino logic stage, the power node may be a first node supplying power voltage Vdd.

However, when a clock signal CLK is low (S10=NO) and a current domino logic stage is the first domino logic stage 14-1 (S30=YES), the first domino logic stage 14-1 pre-charges its own dynamic node DN1 with a pre-charge voltage in response to the clock signal CLK (S31). However, when the clock signal CLK is low (S10=NO) and each current domino logic stage 14-2 to 14-$n$ is not the first domino logic stage 14-1

(S30=NO), each current domino logic stage 14-2 to 14-n pre-charges its own dynamic node with a pre-charge voltage in response to an output signal of a corresponding inverter among inverters connected in series (S33).

FIG. 12 is a flowchart summarizing one possible operation for the pipelined domino logic circuit 10' of FIG. 4. Referring to FIGS. 4, 5, and 12, the domino clock signal generation circuit 20' of FIG. 4 generates domino clock signals CLK11 to CLK20 illustrated in FIG. 6 in response to the clock signal CLK (S110).

During a pre-charge phase, each dynamic node of domino logic stages 14-1 to 14-10 is pre-charged with a pre-charge voltage or a ground voltage VSS in response to each of the domino clock signals CLK11 to CLK20 (S120).

During an evaluation phase, the first domino logic stage 14-1 determines, based on input data signals D0 and A0, input to each of transistors N12 to N13 connected between a dynamic node DN1 and ground VSS through an evaluation transistor N14, a logic level of the dynamic node DN1 (S130). During an evaluation phase, the logic level of each dynamic node of the rest domino logic stages is sequentially determined in response to one or more data signals of a current dynamic stage and an output signal of a previous domino logic stage, which are input to transistors connected directly between the each dynamic node and a power node (S140).

Consistent with the foregoing exemplary embodiments, a domino logic circuit according to an embodiment of the inventive concept may be embodied in a smaller physical space than an analogous conventional circuit. Further, a domino logic circuit according to an embodiment of the inventive concept may be operated with reduced power consumption, and relatively higher speed than an analogous conventional circuit.

Although several embodiments of the inventive concept have been shown and described, it will be appreciated by those skilled in the art that changes may be made in these embodiments without departing from the scope of the inventive concept as defined by the appended claims and their equivalents.

What is claimed is:

1. A domino logic circuit comprising:
a pre-charge circuit configured to pre-charge a first dynamic node in response to a clock signal output from a first inverter;
a first logic network configured to determine a logic level of the first dynamic node in response to first data signals;
a second inverter configured to receive the clock signal output from the first inverter;
a discharge circuit configured to discharge a second dynamic node in response to an output signal of the second inverter; and
a second logic network configured to determine a logic level of the second dynamic node in response to one or more second data signals and an output signal of the first dynamic node.

2. The circuit of claim 1, wherein at least one of the first logic network and the second logic network is a NAND gate.

3. The circuit of claim 1, wherein at least one of the first logic network and the second logic network is a NOR gate.

4. The circuit of claim 1, wherein at least one of the first logic network and the second logic network is either an AND-OR-Invert (AOI) gate or an OR-AND-Invert (OAI) gate.

5. The circuit of claim 1, wherein the pre-charge circuit comprises a first PMOS transistor connected between a power node and the first dynamic node and having a gate receiving the clock signal,
the first logic network comprises first NMOS transistors connected in series between the first dynamic node and ground, each of the first NMOS transistors having a gate receiving one of the first data signals,
the second logic network comprises second PMOS transistors connected in series between the power node and the second dynamic node, each of the second PMOS transistors having a gate receiving the one or more second data signals and the output signal of the first dynamic node, and
the discharge circuit comprises a second NMOS transistor connected between the second dynamic node and ground and having a gate receiving an output signal of the second inverter.

6. The circuit of claim 5, wherein a threshold voltage of the first PMOS transistor is less than a threshold voltage of each of the second PMOS transistors, and
a threshold voltage of the second NMOS transistor is less than a threshold voltage of each of the first NMOS transistors.

7. A pipelined domino logic circuit comprising:
a plurality of domino logic stages series connected between a latch and a flip-flop and including a first domino stage having a first dynamic node, and second through Nth domino logic stages each having a corresponding dynamic node,
wherein during an evaluation phase, a logic level of the first domino logic stage is determined in response to an output signal of the latch and at least one input data signal applied to transistors connected between the first dynamic node and ground through an evaluation transistor, and
during the evaluation phase, a logic level for each corresponding dynamic node of the second through Nth domino logic stages is respectively determined in sequence as a current domino logic stage in response to at least one data signal applied to the current domino logic stage and an output signal provided by a previous domino logic stage as respectively applied to transistors connected directly between the corresponding dynamic node and a power node; and
an inverter chain including a plurality of series-connected inverters,
wherein during a pre-charge phase, a logic level of the first dynamic node is pre-charged in response to a clock signal supplied to the inverter chain, and a logic level of each corresponding dynamic node of the second through Nth domino logic stages is sequentially pre-charged in response to respective different domino stage clock signals provided by the inverters.

8. The circuit of claim 7, wherein the second through Nth domino logic stages are provided as alternatingly arranged N-domino logic stages and P-domino logic stages, such that when the current domino logic stage is an N-domino logic stage the power node is a second node connected to ground, and when the current domino logic stage is a P-domino logic stage, the power node is a first node receiving a power supply voltage.

9. A pipelined domino logic circuit comprising:
a plurality of domino logic stages including an alternating arrangement of series-connected N-domino logic stages and P-domino logic stages; and
a domino clock signal generation circuit comprising a plurality of inverters configured to generate a plurality of domino stage clock signals derived from a clock signal, the domino stage clock signals having respective different delays and one of two alternating phases, wherein during a pre-charge phase each dynamic node respectively associated with one of the plurality of domino logic stages is sequentially pre-charged in response to a corresponding one of the plurality of domino stage clock signals generated by the inverters.

10. The circuit of claim 9, wherein a first N-domino logic stage among the plurality of domino logic stages comprises:
a pre-charge circuit configured to pre-charge a first dynamic node in response to a first domino stage clock signal having a first phase; and
a first logic network configured to determine a logic level of the first dynamic node in response to first data signals.

11. The circuit of claim 10, wherein a first P-domino logic stage directly connected to the first N-domino logic stage comprises:
a discharge circuit configured to discharge a second dynamic node of the first P-domino logic stage in response to a second domino stage clock signal having a second phase opposite that of the first phase; and
a second logic network configured to determine a logic level of the second dynamic node in response to at least one second data signal and an output signal of the first dynamic node.

12. The circuit of claim 9, wherein the domino clock signal generation circuit generates at least two domino stage clock signals having a synchronized edge.

13. A central processing unit (CPU) comprising:
an arithmetic logic unit (ALU) and a control unit that controls operation of the ALU, wherein the ALU comprises a plurality of domino logic stages including an alternating arrangement of N-domino logic stages and P-domino logic stages connected in series between a latch and a flip-flop and including a first domino stage having a first dynamic node, and second through Nth domino logic stages each having a corresponding dynamic node,
wherein during an evaluation phase, a logic level of the first domino logic stage is determined in response to an output signal of the latch and at least one input data signal applied to transistors connected between the first dynamic node and ground through an evaluation transistor, and
during the evaluation phase, a logic level for each corresponding dynamic node of the second through Nth domino logic stages is respectively determined in sequence as a current domino logic stage in response to at least one data signal applied to the current domino logic stage and an output signal provided by a previous domino logic stage as respectively applied to transistors connected directly between the corresponding dynamic node and a power node; and
a domino clock signal generation circuit comprising a plurality of inverters configured to generate a plurality of domino stage clock signals derived from a clock signal and each having respective different delays and one of two opposing phases,
wherein during a pre-charge phase each dynamic node of the domino logic stages is pre-charged in response to a corresponding one of the plurality of domino stage clock signals generated by the inverters.

14. The CPU of claim 13, wherein the domino clock signal generation circuit generates at least two domino stage clock signals having a synchronized edge.

15. A data processing device comprising:
a memory device and a central processing unit (CPU) that controls operation of the memory device, wherein the CPU includes an arithmetic logic unit(ALU) and a control unit that controls operation of the ALU,
wherein the ALU comprises:
a plurality of domino logic stages including an alternating arrangement of N-domino logic stages and P-domino logic stages connected in series between a latch and a flip-flop and including a first domino stage having a first dynamic node, and second through Nth domino logic stages each having a corresponding dynamic node,
wherein during an evaluation phase, a logic level of the first domino logic stage is determined in response to an output signal of the latch and at least one input data signal applied to transistors connected between the first dynamic node and ground through an evaluation transistor, and
during the evaluation phase, a logic level for each corresponding dynamic node of the second through Nth domino logic stages is respectively determined in sequence as a current domino logic stage in response to at least one data signal applied to the current domino logic stage and an output signal provided by a previous domino logic stage as respectively applied to transistors connected directly between the corresponding dynamic node and a power node, and
a domino clock signal generation circuit comprising a plurality of inverters configured to generate a plurality of domino stage clock signals derived from a clock signal and each having respective different delays and one of two opposing phases,
wherein during a pre-charge phase each dynamic node of the domino logic stages is pre-charged in response to a corresponding one of the plurality of domino stage clock signals generated by the inverters.

16. The device of claim 15, wherein the data processing device is one of a personal computer (PC), a portable device, and a system on chip.

* * * * *